United States Patent [19]

Cripe et al.

[11] Patent Number: 5,851,928
[45] Date of Patent: Dec. 22, 1998

[54] METHOD OF ETCHING A SEMICONDUCTOR SUBSTRATE

[75] Inventors: Jerry D. Cripe, Tempe; Jerry L. White, Glendale; Carl E. D'Acosta, Mesa, all of Ariz.

[73] Assignee: Motorola, Inc., Schaumburg, Ill.

[21] Appl. No.: 562,865

[22] Filed: Nov. 27, 1995

[51] Int. Cl.$^6$ .................................................. H01L 21/302
[52] U.S. Cl. ........................ 438/748; 438/460; 438/700
[58] Field of Search .................................. 438/700, 701, 438/704, 705, 745, 747, 748, 427, 464, 421, 424, 749, 750

[56] References Cited

U.S. PATENT DOCUMENTS

| | | |
|---|---|---|
| 3,773,578 | 11/1973 | Glendinning et al. . |
| 3,844,858 | 10/1974 | Bean ........................................ 438/404 |
| 4,566,171 | 1/1986 | Nelson et al. ............................ 438/494 |
| 4,961,821 | 10/1990 | Drake et al. ............................. 438/701 |
| 4,962,062 | 10/1990 | Uchiyama ................................ 438/424 |
| 5,119,171 | 6/1992 | Lesk et al. . |
| 5,180,469 | 1/1993 | Abe . |
| 5,462,636 | 10/1995 | Chen et al. . |
| 5,470,790 | 11/1995 | Myers ...................................... 438/701 |
| 5,550,088 | 8/1996 | Dautartas et al. ....................... 438/701 |
| 5,556,797 | 9/1996 | Chi et al. ................................ 438/701 |

*Primary Examiner*—John Niebling
*Assistant Examiner*—S. Mulpuri
*Attorney, Agent, or Firm*—George C. Chen

[57] ABSTRACT

A method of etching a semiconductor substrate (11) includes thinning (102) the semiconductor substrate (11), providing (103) a support layer (30) for the semiconductor substrate (11), providing (104) an etch mask (28) over the semiconductor substrate (11), and etching (105) the semiconductor substrate (11) using an etchant mixture of hydrofluoric acid, nitric acid, phosphoric acid, sulfuric acid, and a wetting agent at a temperature below ambient. The method is capable of using one etch step (105) and one etch mask (28) to form a plurality of trenches (12, 13) having the same width (15, 17) but different depths (16, 18) and different orientations. The method can be used to singulate different sizes and configurations of semiconductor dice from the semiconductor substrate (11).

26 Claims, 2 Drawing Sheets

METHOD OF ETCHING A SEMICONDUCTOR SUBSTRATE

BACKGROUND OF THE INVENTION

This invention relates, in general, to a method of manufacturing a semiconductor component, and more particularly, to a method of etching a semiconductor.

In high volume production processes, semiconductor die singulation is conventionally accomplished by mechanically sawing a semiconductor substrate into individual semiconductor dice. Other singulation techniques include an etching process combined with a mechanical sawing technique, a mechanical scribe and break technique, and an ultrasonic technique. However, all of these mechanical singulation techniques physically damage the semiconductor dice.

Furthermore, these singulation techniques can only cut one shape and size of semiconductor die out of a single semiconductor substrate. If a semiconductor substrate has more than one shape or size of semiconductor die, only one of the shapes and sizes can be cut out of the semiconductor wafer. Semiconductor dice having the other shapes or sizes cannot be cut from the same semiconductor substrate and are wasted.

Moreover, these prior art singulation techniques are not suitable for fabricating semiconductor dice with curved or round peripheries. Conventional singulation techniques such as mechanical sawing are suited for cutting straight, not curved, lines or paths in a semiconductor substrate.

Laser techniques have been used to singulate semiconductor dice of different shapes, but the heat generated by the laser thermally stresses and damages the semiconductor dice. Also, laser techniques produce surface contamination or slag on the semiconductor dice. Consequently, the slag must be removed by an additional process step, which increases the cycle time of the die singulation process.

Etching techniques for die singulation do not mechanically damage the semiconductor dice. However, the conventional dry and wet etchants used to etch semiconductor substrates produce many other problems when applied to die singulation. For example, due to the thickness of a conventional semiconductor substrate, conventional etch processes are very time consuming when used to singulate semiconductor dice. Additionally, when etching large depths into a semiconductor substrate, conventional etch processes produce large quantities of undercut in the semiconductor substrate. Consequently, conventional etch processes are not cost efficient because of the large portions of the semiconductor substrate that are undercut and wasted.

Prior art wet etchants for micromachining or forming deep trenches in semiconductor substrates are dependent on the crystal orientation or the semiconductor substrate. Consequently, for a given wet etchant, if the crystal orientation is changed, the deep trench profile is different. If the deep trench profile is desired to be the same on a different crystal orientation, a different etchant must be used. As a result, the use of prior art wet etchants for micromachining or forming deep trenches in semiconductor substrates is limited.

Accordingly, a need exists for an improved method of etching a semiconductor substrate. The method should be manufacturable, cost effective, and easy to integrate into existing semiconductor process flows. The method should also be capable of singulating semiconductor dice of different shapes or sizes from a single semiconductor substrate. In addition, the method should be independent of the crystal orientation of the semiconductor substrate.

DETAILED DESCRIPTION OF THE DRAWINGS

Figure 1:
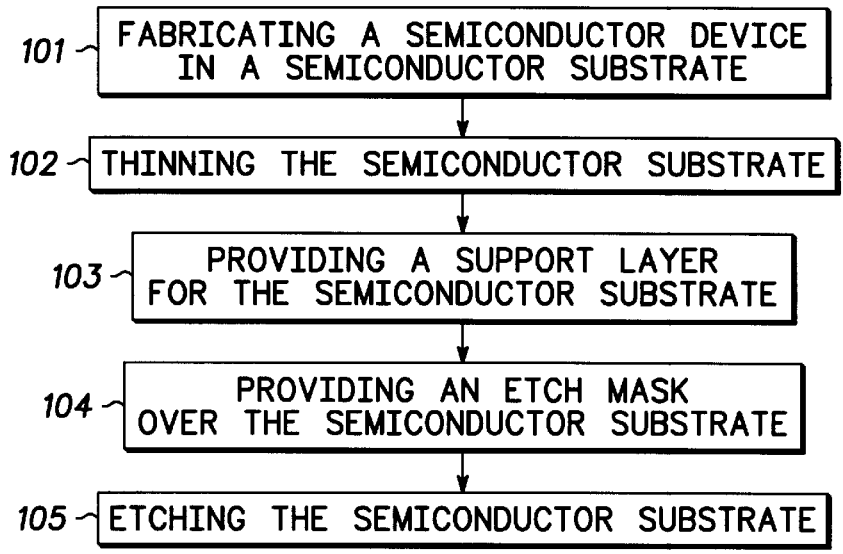
FIG. 1 outlines a method of etching a semiconductor substrate in accordance with the present invention.

Turning to the figures for a detailed description, FIG. 1 outlines a method of etching a semiconductor substrate in accordance with the present invention. FIG. 1 portrays a method 100 beginning with a step 101, which fabricates at least one semiconductor device in or on a semiconductor substrate. In a preferred embodiment, the semiconductor substrate is comprised of semiconducting materials such as, for example, a silicon substrate or a gallium arsenide substrate. The semiconductor device is fabricated using conventional semiconductor manufacturing techniques such as, for example, ion implantation processes, thermal annealing procedures, lithographic processes, metal sputtering techniques, and chemical vapor deposition processes.

Method 100 continues with steps 102 and 103, which thin the semiconductor substrate and which provide a support layer for the semiconductor substrate, respectively. In an embodiment of the present invention where the semiconductor device is fabricated in a first surface of the semiconductor substrate, step 102 thins the semiconductor substrate from a second surface, wherein the second surface is opposite the first surface of the semiconductor substrate. The semiconductor substrate is thinned using conventional techniques including, but not limited to, first mechanically grinding and then wet etching the semiconductor substrate. In a preferred embodiment, the semiconductor substrate has a diameter of 100 millimeters (mm) and is thinned from a thickness of approximately 575 microns to a thickness of approximately 150 microns.

The support layer of step 103 can support the first or second surface of the semiconductor substrate. The support layer is used to provide support for and to strengthen the semiconductor substrate. The support layer reduces the probability of breaking or fracturing the semiconductor substrate. The support layer is formed using conventional techniques. Accordingly, the support layer can be comprised of an adhesive and a thick substrate such as, for example, a polymer, a polyimide, a wax, cyanoacrylate, silicon, silicone, polyurethane, polysulphone, or other appropriate materials, but is preferably comprised of an epoxy.

Continuing with method 100, step 104 provides a patterned mask layer or etch mask over the semiconductor substrate. In the embodiment of the present invention where the support layer of step 103 supports the semiconductor substrate from the first surface, the etch mask of step 104 is disposed, deposited, or formed over the second surface of the semiconductor substrate. Formation of the etch mask is accomplished using conventional processes.

Finally, step 105 of method 100 etches the semiconductor substrate while using the etch mask of step 104 to define an etched pattern in the semiconductor substrate. Accordingly, the etch mask of step 104 should be comprised of a material that is substantially resistant to the etchant used in step 105. In a preferred embodiment, step 105 of FIG. 1 can be performed in an etch tool having a flow nozzle to dispense a wet etchant onto the semiconductor substrate. As an example, Semiconductor Equipment Zubehör (SEZ) of Villach, Austria manufactures a flow nozzle etch tool having a model number RST100. Additional details of method 100 are more clearly described in view of FIGS. 2 and 3.

Figure 2:
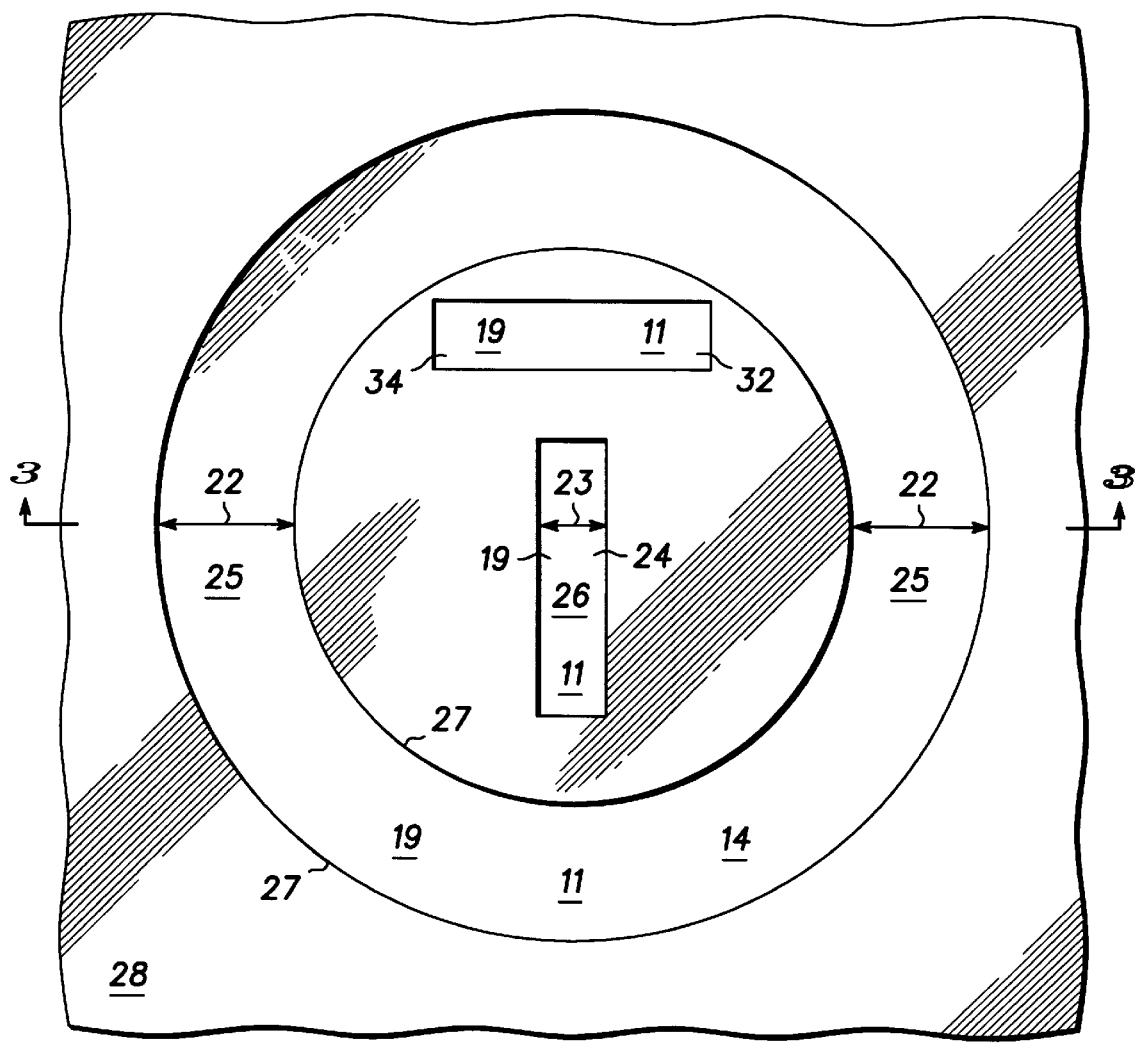
FIG. 2 illustrates an enlarged top view of a semiconductor component in accordance with the present invention.

Referring to the subsequent figure, FIG. 2 illustrates an enlarged top view of a semiconductor component in accordance with the present invention. A semiconductor component 10 is depicted as having a patterned mask layer or etch mask 28 that has openings 25 and 26. As indicated in step 104 of FIG. 1, etch mask 28 is located over a surface 19 of a semiconductor substrate 11, which is more clearly illustrated in FIG. 3. In FIG. 2, etch mask 28 has openings 25, 26, and 32 that expose portions 14, 24, and 34 respectively, of surface 19. Opening 25 has a round or curved periphery 27 and a width 22. Opening 26 has a width 23 that is smaller than width 22. Opening 32 is similar in size and shape to opening 26, but opening 32 is perpendicular to opening 26.

Figure 3:
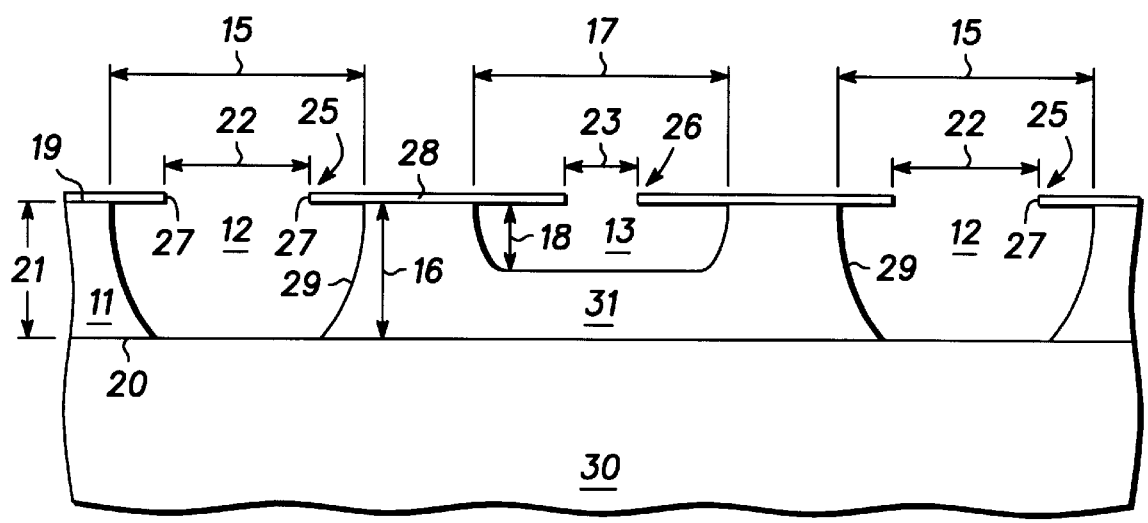
FIG. 3 portrays an enlarged cross-sectional view of the semiconductor component taken along reference line 3—3 of FIG. 2.

Continuing with the detailed description of the drawings, FIG. 3 portrays an enlarged cross-sectional view of the semiconductor component taken along reference line 3—3 of FIG. 2 in accordance with the present invention. As described in steps 101 and 102 of FIG. 1, FIG. 3 illustrates a thinned semiconductor substrate 11 with a surface 20 opposite surface 19 and with a thickness 21, which is preferably about 100–200 microns. At least one semiconductor device is fabricated in or on surfaces 19 or 20. Additionally, as described in step 103 of FIG. 1, FIG. 3 depicts a support layer 30 supporting surface 20 of semiconductor substrate 11. Moreover, as described in step 104 of FIG. 1 and as depicted in FIG. 2, FIG. 3 portrays etch mask 28 over surface 19 of semiconductor substrate 11.

As described above, etch mask 28 is used with an etchant to form or create an etched pattern in semiconductor substrate 11. In particular, openings 25 and 26 of etch mask 28 determine the size and location of trenches 12 and 13, respectively. Preferably, a wet isotropic etchant forms trench 12 by removing portion 14 of semiconductor substrate 11, which is exposed by opening 25, and the wet isotropic etchant is also used to simultaneously form trench 13 by removing portion 24 of semiconductor substrate 11, which is exposed by opening 26. Trenches 12 and 13 have widths 15 and 17, respectively, and depths 16 and 18, respectively.

Step 105 of FIG. 1 undercuts etch mask 28 of FIG. 3. In a preferred embodiment, etch mask 28 is comprised of a rigid material that substantially maintains its configuration during the undercutting of trenches 12 and 13. Accordingly, etch mask 28 can be comprised of suitable hard mask materials including, but not limited to, chrome, titanium nitride, titanium tungsten nitride, photoresist, or nickel chrome. However, etch mask 28 preferably comprises silicon nitride or gold.

The wet isotropic etchant of step 105 preferably comprises a mixture of hydrofluoric acid, nitric acid, phosphoric acid, sulfuric acid, and a wetting agent. The wetting agent preferably comprises a hydrocarbon chemical such as, for example, octylamine. In another preferred embodiment, the volume ratio of the constituents of the mixture ranges from approximately 1:1:0.3:0.3:0.0001 to 1:1:0.7:0.7:0.05 for the hydrofluoric acid, the nitric acid, the phosphoric acid, the sulfuric acid, and the wetting agent, respectively. In other words, in the preferred embodiment, the volume ratio between the wetting agent and the other chemistries can vary from approximately 0.0001 to 0.05. Additionally, in the preferred embodiment, the ratio between the volume of the phosphoric acid and the volume of the sulfuric acid preferably remains 1:1 even though the volume ratio between the phosphoric acid and the other chemistries can vary from approximately 0.3 to 0.7 and even though the volume ratio between the sulfuric acid and the other chemistries can also vary from approximately 0.3 to 0.7.

In accordance with the preferred volume ratios described above, the hydrofluoric, nitric, phosphoric, and sulfuric acids have preferred assay numbers of 49 percent (%), 70%, 85%, and 96%, respectively. When the phosphoric and sulfuric acid volume ratios are both 0.3, the silicon etch rate is faster compared to when the volume ratios are both 0.7. As the etch process of step 105 continues, the hydrofluoric acid may become depleted. Therefore, more hydrofluoric acid may be added to the etchant mixture, which will change the initial volume ratios described above.

In a preferred embodiment, semiconductor substrate 11 is rotated about its center at a rate of approximately 500–1,700 revolutions per minute, and the dispense rate of the etching mixture is approximately 0.5–2.0 liters per minute. As mentioned above, the etching mixture is preferably dispensed through a flow nozzle, not a spray nozzle, to produce a more uniform etch. In a preferred embodiment, the flow nozzle radially dispenses the etching mixture onto semiconductor substrate 11. When semiconductor substrate 11 is a wafer having a 100 mm diameter, the flow nozzle preferably swings approximately ±23 mm from the center of the of semiconductor substrate 11 at 0.1 mm increments. The etch process of step 105 in method 100 is preferably about 1 to 3 minutes long.

Another feature of the etch process of step 105 is that the etching mixture is cooled to a temperature below ambient or below approximately 25 degrees Celsius (° C.). Specifically, it is desirable to cool the etching mixture down to below approximately 18° C. prior to etching trenches 12 and 13 in semiconductor substrate 11. At a temperature below approximately 18° C. and with the preferred substrate rotation rate, flow nozzle dispense rate, and radial dispense pattern, the silicon etch rate of semiconductor substrate 11 in step 105 is preferably 25–100 microns per minute.

While the mixture used in step 105 is a wet isotropic etchant, a substantially anisotropic etch is performed in step 105. The substantially anisotropic characteristic of trenches 12 and 13 is due to the rotation of semiconductor substrate 11, the preferred dispense rate of the etchant mixture, and the preferred subambient temperature of the etchant mixture. This anisotropic characteristic of the present invention reduces the amount of semiconductor substrate 11 that is undercut during step 105 and does not waste as much of the semiconductor substrate compared to the prior art etching techniques.

It is understood that the etching mixture of step 105 undercuts etch mask 28 such that width 15 of trench 12 and width 17 of trench 13 are larger than width 22 of opening 25 and width 23 of opening 26, respectively. It is noted that widths 15 and 17 are preferably approximately equal. It is also noted that because width 22 of opening 25 is larger than width 23 of opening 26, depth 16 of trench 12 is deeper than depth 18 of trench 13. In other words, the depth of the trench is proportional to the size of the etch mask opening, but the width of the trench is preferably not proportional to the size of the etch mask opening and is also preferably not proportional to the depth of the trench. Therefore, a single etch mask having different sized openings and a single etch step can be used to simultaneously form a plurality of trenches having a plurality of different depths in a single semiconductor substrate.

Step 105 of the present invention is also independent of the crystal orientation of semiconductor substrate 11.

Therefore, step 105 can etch deep trenches that have substantially similar profiles and that are oriented at 90 degrees or are perpendicular to each other. FIG. 2 portrays opening 32 that is perpendicular to and is similar in size to opening 26. Accordingly, step 105 forms deep trenches in portions 34 and 24 of semiconductor substrate 11 that have substantially similar profiles and are perpendicular to each other. Prior art wet etch chemistries do not have the versatility or the flexibility to form deep trenches that are perpendicular to each other and that have depths of over 20 microns. While FIG. 2 depicts trenches to be formed at a 90 degree orientation from each other, one skilled in the art will understand that trenches of different orientations can be similarly fabricated using method 100 of the present invention.

The use of a single etch mask and a single etch step in method 100 to produce trenches with different depths is believed to be explained by the following physical and chemical mechanisms. First, the silicon substrate is oxidized by the nitric acid, which forms a boundary layer over the surface of the silicon substrate. Second, the dissolution or etching of the oxidized silicon or silicon oxide is performed by the hydrofluoric acid, which must pass through the nitric acid boundary layer to etch the silicon oxide. The silicon etch rate is dependent upon the flow rate of the hydrofluoric and nitric acids to the surface of the silicon substrate. Because the silicon substrate is spinning during the etch process, the flow rate over the silicon surface of the hydrofluoric and nitric acids is increased, and the effective viscosity of the acids is decreased. With a lower viscosity, the boundary layer of the nitric acid is thinner, which enables the hydrofluoric acid to pass through the boundary layer more quickly. The sulfuric and phosphoric acids of the etching mixture are believed to help maintain a thin nitric acid boundary layer over the semiconductor substrate. Consequently, the silicon etch rate or the reaction rate is increased by rotating the semiconductor substrate during the etch process of step 105.

Along with the increased flow rate and lower viscosity of the hydrofluoric and nitric acids, substrate rotation during the etching process reduces heating of the substrate surface because the individual etchant and output reactant molecules are in contact with the wafer for a much shorter period of time. As a result, problems commonly associated with thermal runaway issues due to exothermic chemical reactions are alleviated by the etch process of the present invention.

A wider opening in etch mask 28 produces a faster flow rate for the etching mixture in a trench, and a faster flow rate produces less undercut in a trench and also produces a deeper trench. Because opening 25 is wider than opening 26, the etching mixture has a faster flow rate through opening 25 compared to opening 26. Accordingly, because trench 12 is below opening 25 and trench 13 is below opening 26, trench 12 has less undercut compared to trench 13. Using the preferred sizes of openings 25 and 26 that are listed below, the larger etch mask opening and less undercut produces a trench preferably having substantially the same width as a trench produced from a smaller etch mask opening and more undercut. Consequently, width 15 of deeper trench 12 is preferably substantially equal to width 17 of shallower trench 13.

In a preferred embodiment, width 22 of opening 25 is approximately 18–22 microns wide, and width 23 of opening 26 is approximately 13–17 microns wide. Accordingly, after completing step 105 of FIG. 1, widths 15 and 17 in FIG. 3 are approximately 150–250 microns wide; depth 16 is approximately 100–200 microns deep; and depth 18 is approximately 25–125 microns deep. The aspect ratio between the depth and the width of trenches 12 and 13 is preferably approximately 0.5 to 1.2.

In the illustrated embodiment of FIG. 3, the depth of trench 12 is equal to the thickness of semiconductor substrate 11. Accordingly, the etch process of step 105 in FIG. 1 preferably etches through semiconductor substrate 11 by isotropically wet etching from surface 19 to surface 20 of semiconductor substrate 11. In this preferred embodiment, the formation of trench 12 exposes a portion of support layer 30, and therefore, singulates, separates, or isolates a semiconductor die 31 from semiconductor substrate 11. Semiconductor die 31 contains at least one semiconductor device.

After step 105, etch mask 28 is removed using conventional processes. Support layer 30 can be removed or can remain on surface 20 of semiconductor substrate 11 during subsequent processing of semiconductor die 31.

Therefore, method 100 of FIG. 1 can be used to singulate semiconductor dice from a semiconductor substrate without mechanically stressing the semiconductor dice. Consequently, method 100 does not physically damage the semiconductor dice compared to the mechanical singulation techniques of the prior art.

It is understood that the general shape of opening 25 is transferred from etch mask 28 into semiconductor substrate 11. Therefore, because opening 25 has curved periphery 27, a periphery 29 of semiconductor die 31 also has a round or curved portion. Accordingly, one skilled in the art will recognize that different shapes, sizes, configurations, and geometries of semiconductor die can be singulated from semiconductor substrate 11.

Periphery 29 of semiconductor die 31 is preferably curved or round to eliminate isothermic problems of conventional rectangular die and to improve the thermal dissipation from semiconductor die 31. With improved thermal dissipation, computer simulations have predicted that junction temperatures of the semiconductor devices within semiconductor die 31 can be lowered by 25° C. or more. Consequently, with a round or circular periphery, the reliability of semiconductor die 31 can be improved, and the speed of the integrated circuit within semiconductor die 31 can be increased. Computer simulations have shown an increase of up to 50 MHz in circuit speed when round semiconductor die are used.

The etchant mixture described above can be used on silicon substrates having a <100> crystal orientation or a <111> crystal orientation. However, prior art etch chemistries such as, for example, potassium hydroxide that are used to etch deep trenches are dependent upon the crystal orientation of the silicon substrate. Consequently, the etchant mixture of step 105 is more flexible compared to the etchant mixtures of the prior art. As described previously, the present invention is capable of simultaneously forming a first trench having a different orientation than a second trench, wherein the first trench has a substantially similar profile to the second trench.

Furthermore, prior art etch chemistries are highly exothermic and suffer from thermal runaway issues due to surface heating effects. Examples of such prior art etch chemistries include, but are not limited to, potassium hydroxide and a mixture of hydrofluoric acid, nitric acid, and acetic acid. In the prior art mixture of hydrofluoric, nitric, and acetic acids, the acetic acid is used to control the nitric acid boundary layer, but acetic acid decomposes at higher temperatures. Consequently, the acetic acid of the prior art mixture loses its effectiveness as the etch process progresses. Due to the exothermic reactions, the prior art etchants suffer from extreme amounts of undercut and pitting. The subject invention's subambient etchant temperature helps to reduce the issues associated with surface heating effects, other temperature related matters, and surfactants.

As mentioned previously, the preferred etch time for step 105 of method 100 is approximately 1 to 3 minutes, which is significantly faster than conventional mechanical sawing techniques for die singulation. Prior art mechanical sawing techniques individually saw each of the paths or "scribe lines." However, step 105 of the present invention etches all of the "scribe lines" at once. Accordingly, the semiconductor die singulation technique of the present invention shortens the cycle time required for die singulation.

Therefore, in accordance with the present invention, it is apparent there has been provided an improved method of etching a semiconductor substrate that overcomes the disadvantages of the prior art. The present invention uses an etchant mixture at a subambient temperature, can use a single wet etch step to singulate semiconductor die, and is capable of using a single mask layer and a single etch step to fabricate trenches having the same width but having varying depths and varying orientations. The present invention eliminates the problems of mechanical damaging semiconductor dice during die singulation and also reduces the amount of undercut and associated with conventional wet etchants.

We claim:

1. A method of etching a semiconductor substrate, the method comprising the steps of:

providing the semiconductor substrate;

providing an etch mask over the semiconductor substrate to expose a portion of the semiconductor substrate, the etch mask having a first opening with a first width and a second opening with a second width less than the first width; and wet etching a hole through the semiconductor substrate while simultaneously wet etching a first trench into the semiconductor substrate wherein the first trench has a depth less than a thickness of the semiconductor substrate, wherein the first opening overlies the hole, wherein the second opening overlies the first trench, wherein the hole and the first trench have an approximately equal width, and wherein the hole and first trench are physically separated from each others, wherein the step of wet etching includes using a mixture of hydrofluoric acid, nitric acid, phosphoric acid, sulfuric acid, and a wetting agent.

2. The method according to claim 1, wherein the step of providing a semiconductor substrate includes selecting the semiconductor substrate from the group consisting of: a first silicon substrate having a <111> crystal orientation, a second silicon substrate having a <100> crystal orientation, or a gallium arsenide substrate having a <100> crystal orientation.

3. The method according to claim 1, wherein the step of providing the etch mask includes selecting the etch mask from the group consisting of: silicon nitride, gold, chrome, titanium nitride, titanium tungsten nitride, photoresist, or nickel chrome.

4. The method according to claim 1, wherein the step of wet etching includes using an etchant below room temperature.

5. The method according to claim 1, wherein the step of wet etching through the semiconductor substrate includes isolating a semiconductor die from the semiconductor substrate.

6. The method according to claim 1, wherein the step of wet etching includes simultaneously wet etching a second trench in the semiconductor substrate, the second trench perpendicular to the first trench, the second trench having a substantially similar profile as the first trench.

7. The method according to claim 5, wherein the step of isolating the semiconductor die from the semiconductor substrate includes forming a curved periphery for the semiconductor die.

8. A method of etching a semiconductor substrate, the method comprising the steps of:

providing the semiconductor substrate;

providing an etch mask over the semiconductor substrate to expose a portion of the semiconductor substrate; and simultaneously wet etching trenches of different depths into the semiconductor substrate at a temperature below ambient, wherein the step of wet etching through the semiconductor substrate includes using a mixture of hydrofluoric acid, nitric acid, phosphoric acid, sulfuric acid, and a wetting agent to etch the semiconductor substrate.

9. A method of fabricating a semiconductor component, the method comprising the step of:

simultaneously isotropically etching a first trench and a second trench in a semiconductor substrate, the first trench having a first depth deeper than a second depth of the second trench, the first and second trenches having equal widths, wherein the step or simultaneously isotropically etching includes using a mixture of hydrofluoric acid, nitric acid, phosphoric acid, sulfuric acid, and a wetting agent.

10. The method according to claim 9, wherein the step of simultaneously forming the first and second trenches includes singulating a semiconductor die from the semiconductor substrate using only the simultaneously forming step.

11. The method according to claim 10, wherein the step of singulating the semiconductor die from the semiconductor substrate includes forming a periphery around the semiconductor die, the periphery having a curved portion.

12. The method according to claim 9, wherein the step of simultaneously forming the first and second trenches includes etching the semiconductor substrate using an etchant at a temperature below approximately 25 degrees Celsius.

13. A method of fabricating a semiconductor component, the method comprising the step of:

simultaneously isotropically etching a first trench and a second trench in a semiconductor substrate, the first trench having a first depth deeper than a second depth of the second trench, wherein the step of simultaneously isotropically etching the first and second trenches includes forming the first trench having a width and forming the second trench having the width of the first trench and includes forming the first trench at a different orientation from the second trench, and wherein the step of simultaneously isotropically etching includes using a mixture of hydrofluoric acid, nitric acid, phosphoric acid, sulfuric acid, and a wetting agent.

14. A method of fabricating a semiconductor component, the method comprising the steps of:

providing a semiconductor substrate having a first surface opposite a second surface;

thinning the semiconductor substrate;

providing a support layer for the second surface of the semiconductor substrate;

disposing a patterned mask layer over the first surface of the semiconductor substrate, wherein the patterned mask layer has a first opening exposing a first portion of the first surface and a second opening exposing a second portion of the first surface, the first opening wider than the second opening; and etching the first and second portions of the first surface of the semiconductor substrate with a mixture comprised of hydrofluoric acid, nitric acid, phosphoric acid, sulfuric acid, and a wetting agent to form a first trench having a first depth located under the first opening of the patterned mask layer and a second trench having a second depth located under the second opening of the patterned mask layer, the first depth greater than the second depth, the temperature of the mixture below 18 degree Celsius.

15. The method according to claim 14, wherein the step of etching the first and second portions of the first surface of the semiconductor substrate with the mixture includes providing a volume ratio of approximately 1:1:0.3:0.3:0.0001 to 1:1:0.7:0.7:0.05 for the hydrofluoric acid, the nitric acid, the phosphoric acid, the sulfuric acid, and the wetting agent, respectively, wherein the volume ratio between the phosphoric acid and the sulfuric acid is approximately 1:1.

16. The method according to claim 15, wherein the step of etching the first and second portions of the first surface of the semiconductor substrate includes:

dispensing the mixture onto the semiconductor substrate at a first rate of approximately 0.5–2.0 liters per minute; and simultaneously rotating the semiconductor substrate at a second rate of approximately 500–1,700 revolutions per minute.

17. The method according to claim 14, wherein the step of etching the first and second portions of the first surface of the semiconductor substrate includes etching the first trench from the first surface to the second surface of the semiconductor substrate.

18. The method according to claim 17, wherein the step of etching the first trench includes singulating a semiconductor die from the semiconductor substrate.

19. The method according to claim 14, wherein the step of etching the first and second portions of the first surface of the semiconductor substrate includes forming the first and second trenches having substantially equal widths.

20. The method according to claim 1 wherein the step of wet etching further comprises etching the hole and the first trench into the same surface of the semiconductor substrate.

21. The method according to claim 6 wherein the step of isotropically wet etching further comprises providing approximately the same width for the first and second trenches wherein the lengths of the first and second trenches are greater than the widths of the first and second trenches.

22. The method according to claim 6 wherein the step of wet etching further comprises preventing the second trench from contacting the first trench and the hole.

23. The method according to claim 9 wherein the step of simultaneously forming further comprises forming the first and second trenches into the same surface of the semiconductor substrate.

24. The method according to claim 9 wherein the step of simultaneously forming further comprising keeping the first and second trenches physically separated from each other.

25. The method of claim 9 wherein the simultaneously isotropically etching step further comprises using a wet etchant to perform the simultaneously isotropically etching step.

26. The method of claim 13 wherein the simultaneously isotropically etching step further comprises simultaneously isotropically wet etching the first and second trenches in the semiconductor substrate.

* * * * *